United States Patent
Lin et al.

(10) Patent No.: US 9,293,338 B2
(45) Date of Patent: Mar. 22, 2016

(54) SEMICONDUCTOR PACKAGING STRUCTURE AND METHOD

(71) Applicant: NANTONG FUJITSU MICROELECTRONICS CO., LTD., Nantong (CN)

(72) Inventors: Chang-Ming Lin, Nantong (CN); Yu-Juan Tao, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 14/074,687

(22) Filed: Nov. 7, 2013

(65) Prior Publication Data

US 2014/0124914 A1 May 8, 2014

(30) Foreign Application Priority Data

Nov. 8, 2012 (CN) .......................... 2012 1 0444097
Nov. 8, 2012 (CN) .......................... 2012 1 0444512

(51) Int. Cl.
*H01L 21/285* (2006.01)
*H01L 23/00* (2006.01)
(Continued)

(52) U.S. Cl.
CPC .......... *H01L 21/28587* (2013.01); *H01L 21/28* (2013.01); *H01L 23/36* (2013.01); *H01L 23/3677* (2013.01); *H01L 23/49861* (2013.01);
(Continued)

(58) Field of Classification Search
CPC ............... H01L 24/13; H01L 2224/73204; H01L 2224/81815; H01L 2224/97; H01L 24/81; H01L 2924/15311; H01L 21/76885; H01L 2225/06513; H01L 23/49816; H01L 2225/06517; H01L 2225/06589; H01L 21/02697; H01L 21/28; H01L 21/283; H01L 21/28587; H01L 21/28114; H01L 21/2815; H01L 21/302; H01L 21/3213
USPC .......... 438/106, 108, 122, 584, 612, 613, 614
See application file for complete search history.

(56) References Cited

U.S. PATENT DOCUMENTS 2,039,960 A * 5/1936 Jacobs .............................. 16/82
5,726,079 A   3/1998 Johnson
(Continued)

FOREIGN PATENT DOCUMENTS

CN   1697148 A   11/2005
CN   1768434 A   5/2006
(Continued)

*Primary Examiner* — Eduardo A Rodela
(74) *Attorney, Agent, or Firm* — Anova Law Group, PLLC

(57) ABSTRACT

A semiconductor packaging method is provided. The method includes providing a semiconductor substrate. The semiconductor substrate has a first surface and a second surface, and an electroplating seed layer on the first surface of the semiconductor substrate. The method also includes forming a plurality of columnar electrodes over the electroplating seed layer, where the columnar electrodes include first columnar electrodes and second columnar electrodes. Further, the method includes forming a diffusion barrier layer over the first columnar electrodes and the second columnar electrodes, forming a plurality of first solder balls over the diffusion barrier layer on the first columnar electrodes. The method also includes providing a packaging substrate having solder terminals corresponding to the first solder balls, and mounting the semiconductor substrate onto the packaging substrate in a flipped position, such that the first solder balls are connected with the solder terminals.

11 Claims, 7 Drawing Sheets

(51) Int. Cl.
  *H01L 21/28* (2006.01)
  *H01L 23/36* (2006.01)
  *H01L 23/367* (2006.01)
  *H01L 23/498* (2006.01)
  *H01L 23/31* (2006.01)

(52) U.S. Cl.
  CPC ............ H01L 24/02 (2013.01); H01L 24/11 (2013.01); H01L 24/13 (2013.01); H01L 24/14 (2013.01); H01L 24/17 (2013.01); H01L 24/81 (2013.01); *H01L 23/3121* (2013.01); *H01L 24/03* (2013.01); *H01L 24/05* (2013.01); *H01L 24/06* (2013.01); *H01L 24/16* (2013.01); *H01L 24/83* (2013.01); *H01L 24/94* (2013.01); *H01L 2224/0239* (2013.01); *H01L 2224/02311* (2013.01); *H01L 2224/02313* (2013.01); *H01L 2224/02331* (2013.01); *H01L 2224/0345* (2013.01); *H01L 2224/03612* (2013.01); *H01L 2224/03614* (2013.01); *H01L 2224/03912* (2013.01); *H01L 2224/0401* (2013.01); *H01L 2224/05025* (2013.01); *H01L 2224/05124* (2013.01); *H01L 2224/05139* (2013.01); *H01L 2224/05144* (2013.01); *H01L 2224/05147* (2013.01); *H01L 2224/05624* (2013.01); *H01L 2224/05639* (2013.01); *H01L 2224/05644* (2013.01); *H01L 2224/05647* (2013.01); *H01L 2224/06102* (2013.01); *H01L 2224/119* (2013.01); *H01L 2224/1132* (2013.01); *H01L 2224/1147* (2013.01); *H01L 2224/1191* (2013.01); *H01L 2224/11462* (2013.01); *H01L 2224/11825* (2013.01); *H01L 2224/11849* (2013.01); *H01L 2224/11903* (2013.01); *H01L 2224/131* (2013.01); *H01L 2224/136* (2013.01); *H01L 2224/13024* (2013.01); *H01L 2224/1357* (2013.01); *H01L 2224/13076* (2013.01); *H01L 2224/13082* (2013.01); *H01L 2224/13084* (2013.01); *H01L 2224/13111* (2013.01); *H01L 2224/13147* (2013.01); *H01L 2224/13541* (2013.01); *H01L 2224/13562* (2013.01); *H01L 2224/13582* (2013.01); *H01L 2224/13609* (2013.01); *H01L 2224/13611* (2013.01); *H01L 2224/13639* (2013.01); *H01L 2224/13644* (2013.01); *H01L 2224/13655* (2013.01); *H01L 2224/14051* (2013.01); *H01L 2224/16225* (2013.01); *H01L 2224/16227* (2013.01); *H01L 2224/16245* (2013.01); *H01L 2224/17106* (2013.01); *H01L 2224/17519* (2013.01); *H01L 2224/73204* (2013.01); *H01L 2224/81191* (2013.01); *H01L 2224/81424* (2013.01); *H01L 2224/81447* (2013.01); *H01L 2224/831* (2013.01); *H01L 2224/92* (2013.01); *H01L 2224/92125* (2013.01); *H01L 2224/94* (2013.01); *H01L 2924/12042* (2013.01); *H01L 2924/15787* (2013.01); *H01L 2924/15788* (2013.01); *H01L 2924/181* (2013.01)

(56) References Cited

U.S. PATENT DOCUMENTS

| | | | | |
|---|---|---|---|---|
| 5,726,502 | A | * | 3/1998 | Beddingfield ............ 257/797 |
| 8,525,333 | B2 | * | 9/2013 | Kanetaka ................. 257/738 |
| 2007/0232053 | A1 | * | 10/2007 | Lee et al. ................. 438/614 |
| 2009/0079094 | A1 | * | 3/2009 | Lin ........................... 257/778 |
| 2011/0101523 | A1 | * | 5/2011 | Hwang et al. ............ 257/737 |
| 2011/0156226 | A1 | * | 6/2011 | Kasuya et al. ........... 257/675 |
| 2012/0252168 | A1 | * | 10/2012 | Nah et al. ................. 438/124 |
| 2012/0273938 | A1 | | 11/2012 | Choi et al. |
| 2012/0319255 | A1 | * | 12/2012 | Zhong et al. ............. 257/666 |
| 2014/0124928 | A1 | * | 5/2014 | Lin et al. .................. 257/738 |

FOREIGN PATENT DOCUMENTS

| | | | |
|---|---|---|---|
| CN | 101552253 | A | 10/2009 |
| CN | 102157476 | A | 8/2011 |
| CN | 102237316 | A | 11/2011 |
| CN | 102254870 | A | 11/2011 |
| CN | 102270590 | A | 12/2011 |
| CN | 102456651 | A | 5/2012 |
| CN | 202917468 | U | 5/2013 |
| JP | 2006108182 | A | 4/2006 |

* cited by examiner

SEMICONDUCTOR PACKAGING STRUCTURE AND METHOD

CROSS-REFERENCES TO RELATED APPLICATIONS

This application claims the priority of Chinese patent application no. 201210444097.6, filed on Nov. 8, 2012, and Chinese patent application no. 201210444512.8, filed on Nov. 8, 2012, the entire contents of all of which are incorporated herein by reference.

FIELD OF THE INVENTION

The present invention generally relates to semiconductor technologies and, more particularly, to the methods and structures for semiconductor packaging.

BACKGROUND

As electronic products become smaller, for the large scale integration (LSI) circuitry and very large scale integration (VLSI) circuitry used in many consumer electronics such as laptops, tablets, smart phones, and digital cameras, there are increasing higher requirements on the feature sizes of semiconductor chips. Thus, the semiconductor packaging structures also need to become smaller and smaller, thinner and thinner.

FIG. 1 shows a cross-sectional view of an existing packaging structure. As shown in FIG. 1, the packaging structure includes: a packaging substrate 10, and a chip 20 disposed on the packaging substrate 10. A first surface 11 of the packaging substrate 10 is disposed opposite to a second surface 21 of the chip 20.

The packaging structure also includes a plurality of solder balls 22 formed on the second surface 21 of the chip 20. The solder balls 22 are electrically connected to the circuits (not shown) in the chip 20, and also connected to conductive terminals 15 on the first surface 11 of the packaging substrate 10. Thus, the circuitry in the chip 20 is connected to external circuitry through the solder balls 22 and the conductive terminals 15.

Further, the packaging structure includes an underfill 30 filled between the chip 20 and the packaging substrate 10, and a resin packaging material 40 covering the chip 20 and the surface of the packaging substrate 10. Because the distance between the chip 20 and the packaging substrate 10 is very small, this distance equals to the height of the solder balls 22. Thus, when the resin packaging material 40 is formed on the chip 20 and the surface of the packaging substrate 10, the resin packaging material 40 would not fill into the gap between the chip 20 and the packaging substrate 10.

Therefore, internal voids can form, which may cause charge and moisture to accumulate and corrosion in the chip and the packaging substrate. Even if the gap between the chip 20 and the packaging substrate 10 is first filled with the underfill 30 and then the chip 20 and the surface of the packaging substrate 10 are covered by the resin packaging material 40, because the gap is small, voids may still be formed between the chip 20 and the packaging substrate 10, impacting the stability and reliability of the chip 20.

The disclosed methods and systems are directed to solve one or more problems set forth above and other problems.

BRIEF SUMMARY OF THE DISCLOSURE

One aspect of the present disclosure includes a semiconductor packaging method. The method includes providing a semiconductor substrate. The semiconductor substrate has a first surface and a second surface, and an electroplating seed layer on the first surface of the semiconductor substrate. The method also includes forming a plurality of columnar electrodes over the electroplating seed layer, where the columnar electrodes include first columnar electrodes and second columnar electrodes. Further, the method includes forming a diffusion barrier layer over the first columnar electrodes and the second columnar electrodes, forming a plurality of first solder balls over the diffusion barrier layer on the first columnar electrodes. The method also includes providing a packaging substrate having solder terminals corresponding to the first solder balls, and mounting the semiconductor substrate onto the packaging substrate in a flipped position, such that the first solder balls are connected with the solder terminals.

Another aspect of the present disclosure includes a semiconductor packaging structure. The packaging structure includes a semiconductor substrate having a first surface and a second surface, and an electroplating seed layer formed on the first surface of the semiconductor substrate. The packaging structure also includes a plurality of columnar electrodes formed over the electroplating seed layer, and the columnar electrodes including first columnar electrodes and second columnar electrodes. Further, the packaging structure includes a diffusion barrier layer formed over the first columnar electrodes and the second columnar electrodes, a plurality of first solder balls formed over the diffusion barrier layer on the first columnar electrodes, and a packaging substrate having solder terminals corresponding to the first solder balls. The semiconductor substrate is mounted onto the packaging substrate in a flipped position, such that the first solder balls are connected with the solder terminals.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 15:
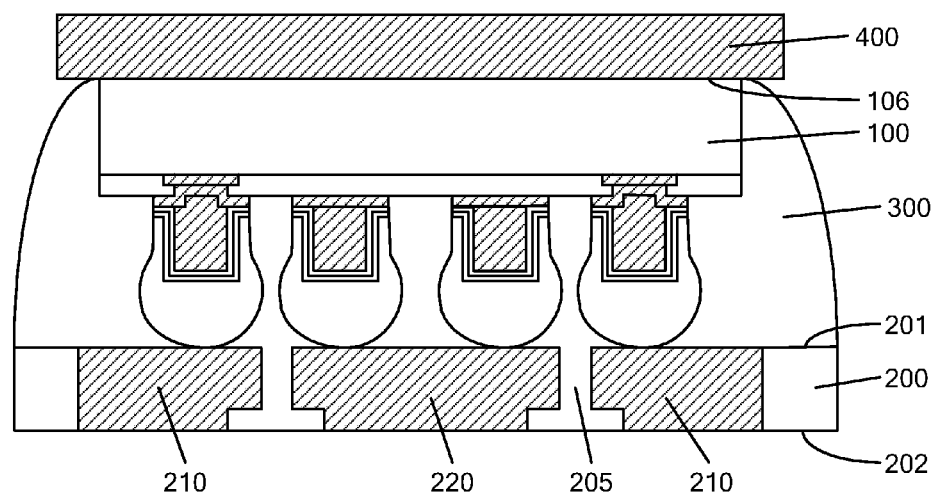
Figure 16:
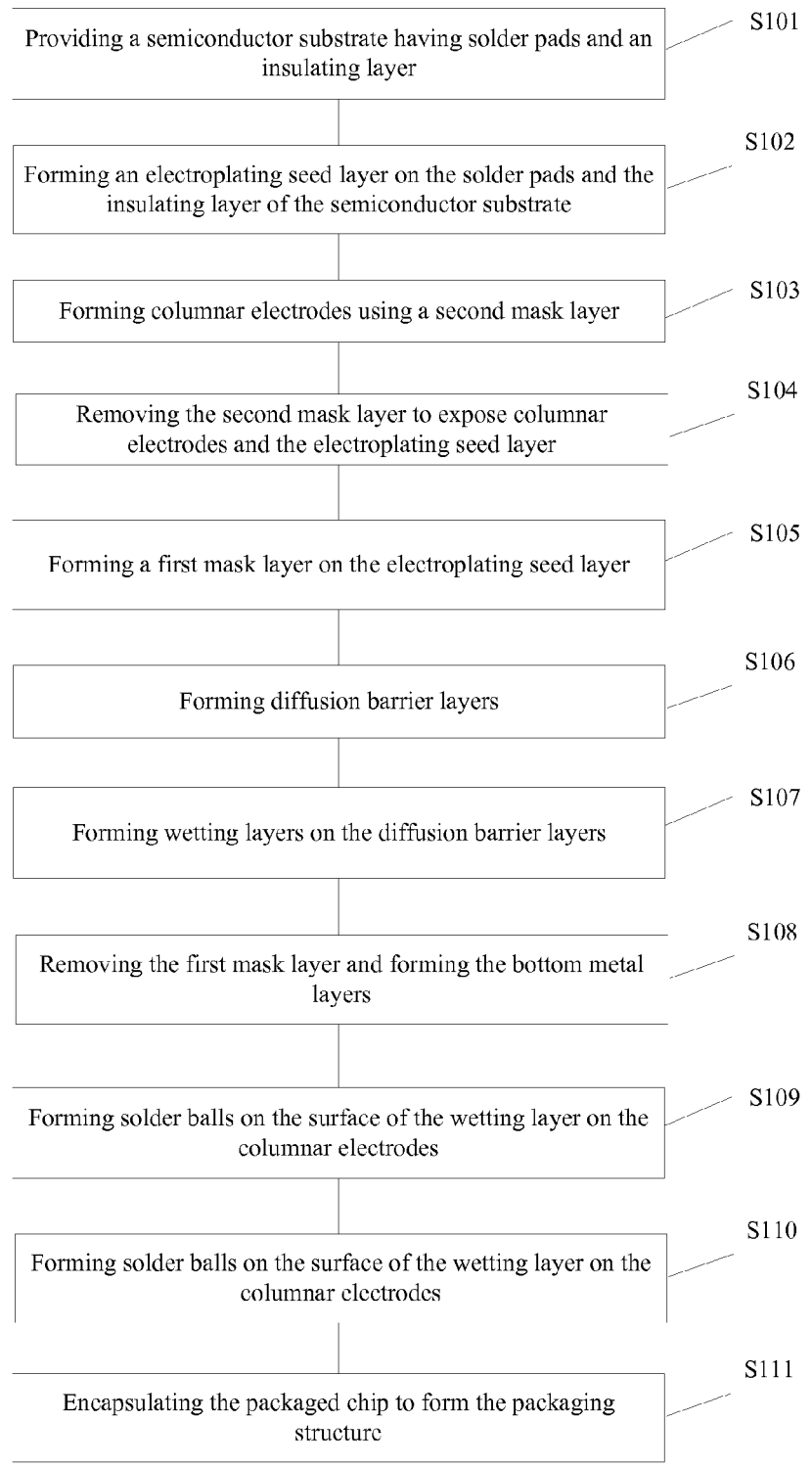
FIG. 16 illustrates a flow diagram of an exemplary packaging process consistent with the disclosed embodiments.

FIG. 16 illustrates a flowchart of an exemplary packaging process consistent with the disclosed embodiments. FIGS. 2-15 illustrate packing structures corresponding to certain stages of the packing process.

Figure 1:
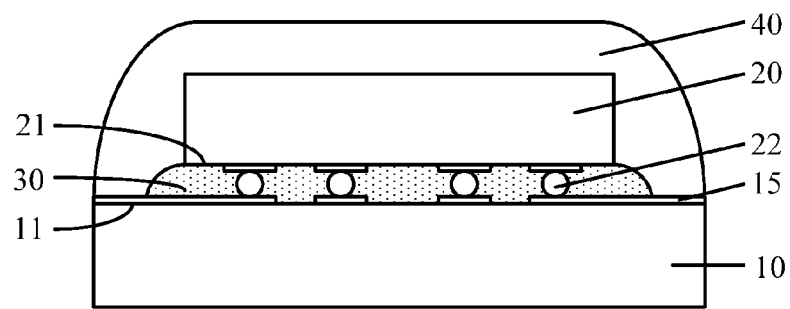
FIG. 1 illustrates an existing packaging structure.
Figure 2:
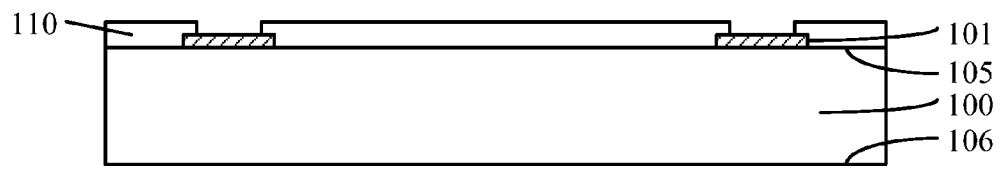
FIGS. 2-15 illustrate exemplary packaging structures corresponding to various steps in a packaging process consistent with the disclosed embodiments.

As shown in FIG. 16, at the beginning of the packaging process, a semiconductor chip or semiconductor substrate is provided (Step S101). FIG. 2 illustrate a corresponding structure.

As shown in FIG. 2, a chip 100 is provided. The chip may also be referred as a semiconductor substrate. The chip 100 has a first surface 105 and a second surface 106, and a plurality of solder pads 101 are formed on the first surface 105 of the chip 100. Further, an insulating layer 110 is formed on the first surface 105 of the chip 100, exposing the solder pads 101.

The chip 100 may be made of any suitable substrate, such as a silicon substrate, a germanium substrate, or a silicon-on-insulator (SOI) substrate, etc. Semiconductor devices (not shown) and metal interconnects (not shown) are formed in the chip 100. The semiconductor devices and the solder pads 101 may be formed on the same surface of the chip 100 or on different surfaces of the chip 100.

When the semiconductor devices and the solder pads are formed on the different surfaces of the chip 100, the solder pads may be electrically connected to the semiconductor devices through silicon vias.

In one embodiment, the semiconductor devices and the solder pads are formed on the first surface 105 of the chip 100; the semiconductor devices are electrically connected to the solder pads, and circuitry of the chip is electrically connected to external circuitry through the solder pads 101.

Further, in certain embodiments, the solder pads 101 and a subsequently-formed electroplating seed layer on the surface of the solder pads 101 may form a metal interconnect layer. A plurality of first columnar electrodes may be subsequently formed on the solder pads 101.

The solder pads 101 may be made of any suitable material, such as aluminum, copper, gold or silver, etc. The semiconductor devices are electrically connected to external circuitry through the solder pads 101 and subsequently-formed first columnar electrodes and first solder balls, etc.

After the solder pads 101 are formed, an insulating material layer is formed on the surfaces of the chip 100 and the solder pads 101. Further, the insulating material layer is etched to expose the solder pads 101 and the etched insulating material layer forms the insulating layer 110. The insulating layer 110 may include one or more of a silicon oxide layer, a silicon nitride layer or a polyimide resin layer, and a benzoxazine resin layer. In one embodiment, the insulating layer 110 is a silicon oxide layer.

In certain embodiments, a passivation layer may be formed on the surface of the isolation layer 110, and the passivation layer covers a portion of solder pads 101. Because the dimension of the solder pads of the chip from the chip manufacturer is relatively large, the dimension of the subsequently-formed columnar electrodes may also be relatively large. Thus, after the passivation layer is formed on the surface of the isolation layer 110 and covers portion of the solder pads, the exposed area of the solder pads is reduced, and the dimension of the later-formed columnar electrodes can also be reduced, resulting in a high-density packaging structure.

Figure 3:
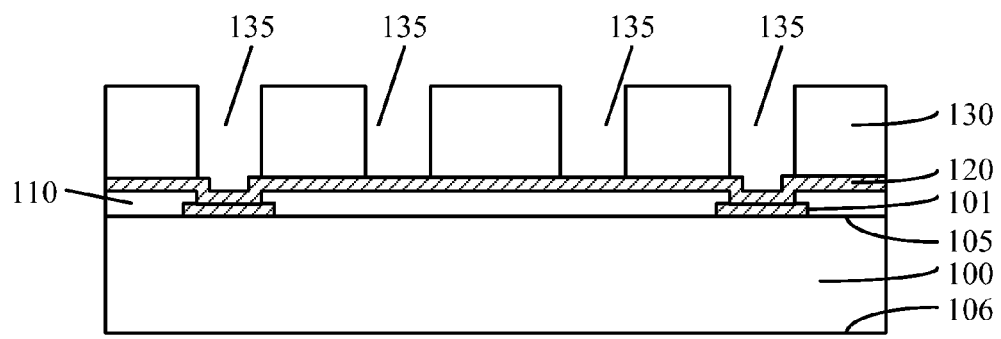

Returning to FIG. 16, after the chip 100 is provided, an electroplating seed layer is formed on the solder pads 101 and the insulating layer 110 (S102). FIG. 3 illustrates a corresponding structure.

As shown in FIG. 3, an electroplating seed layer 120 is formed on the surface of the solder pads 101 and the insulating layer 110. A second mask layer 130 is formed on the surface of the electroplating seed layer 120. Further, second openings 135 are formed in the second mask layer 130. The second openings 135 are formed through the second mask layer 130, exposing a portion of the electroplating seed layer 120.

The electroplating seed layer 120 may be made of any appropriate material, such as aluminum, copper, gold, or silver, or a mixture of one or more thereof. The electroplating seed layer 120 may be formed using any appropriate process, such as a sputtering process or a process of physical vapor deposition (PVD) process.

In certain embodiments, when the electroplating seed layer 120 is made of aluminum, the electroplating seed layer 120 may be formed by a sputtering process. When the electroplating seed layer 120 is made of copper, gold, or silver, the electroplating seed layer 120 may be formed by a physical vapor deposition process. In one embodiment, the electroplating seed layer 120 is made of copper.

In certain embodiments, an under bump metallization (UBM) layer may be formed on the surface of the solder pads 101 and the insulating layer 110, and the UBM layer may be used as the electroplating seed layer.

In one embodiment, the solder pads 101 and the electroplating seed layer 120 formed on the surface of the solder pads 101 and the insulating layer 110 constitute a metal interconnection layer. First columnar electrodes and second columnar electrodes may be later formed on the electroplating seed layer 120.

In certain embodiments, after forming the electroplating seed layer, a redistribution metal layer (or a rewiring metal layer) may be formed on the surface of the electroplating seed layer, and the columnar electrodes and second columnar electrodes may be later formed on the redistribution metal layer.

To improve packaging quality, spacing and location of the final packaging solder points (i.e., the first solder balls) need to be configured as desired. The positions of the packaging solder points are often fixed by the rules, such as being uniformly close to the edge of the chip. However, due to internal wiring, the solder pads of the semiconductor chip are often arranged differently from the desired positions of the final packing structure. Thus, the redistribution metal layer can connect the solder pads to the packaging solder points.

Thus, when the redistribution metal layer is used, the solder pads 101, the electroplating seed layer 120 formed on the surface of the solder pads 101 and the insulating layer 110, and the redistribution metal layer constitute the metal interconnection layer.

The redistribution metal layer may be a single-layer structure or a multi-layer stack structure. One end of the redistribution metal layer is located on the electroplating seed layer on the surface of the solder pads 101, and the other end is located on the electroplating seed layer on the surface of the insulating layer 110. The subsequently-formed first columnar electrodes and second columnar electrodes are formed on the redistribution metal layer on the insulating layer 110. In certain other embodiments, the second columnar electrodes may also be formed the surface of the electroplating seed layer.

In one embodiment, the redistribution metal layer may be formed by the following process: forming a third mask layer on the surface of the electroplating seed layer; forming through trenches in the third mask layer; and forming the redistribution metal layer in the trenches by an electroplating process. One end of the redistribution metal layer is located on the electroplating seed layer on the surface of the solder pads 101, and the other end is located on the electroplating seed layer on the surface of the insulating layer 110.

In other embodiments, a sputtering process or a physical vapor deposition process may be used to form an aluminum metal layer, a copper metal layer, or an aluminum-copper metal layer on the surface of the electroplating seed layer. Further, the aluminum metal layer, the copper metal layer, or the aluminum-copper metal layer is etched using a dry etching process to form the redistribution metal layer. Other processes may also be used.

The second mask layer 130 may be made of any appropriate material, such as one or more of photoresist, silicon oxide, silicon nitride, and amorphous carbon. In one embodiment, the second mask material layer 130 is a photoresist layer. A photolithography process is used to form the second openings 135 in the second mask layer 130. The second openings 135 pass through the second mask layer 130 and may be used to subsequently form the second columnar electrodes. The size of the second opening 135 may be greater than the size of the solder pad 101. Or the size of the second opening 135 may be equal to or less than the size of the solder pad 101.

Figure 4:
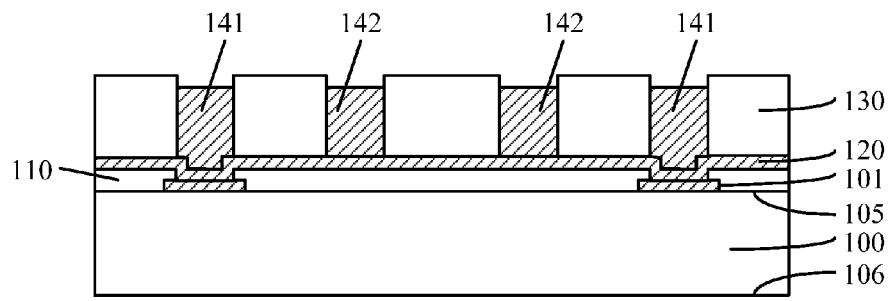

Returning to FIG. 16, after the electroplating seed layer and the second mask layer are formed, columnar electrodes are formed in the second openings 135 (S103). The columnar electrodes may include first columnar electrodes and second columnar electrodes. FIG. 4 illustrates a corresponding structure.

As shown in FIG. 4, first columnar electrodes 141 and second columnar electrodes 142 are formed in the second openings 135. The columnar electrodes may be made of any appropriate metal, such as copper, and the columnar electrodes may be formed by an electroplating process.

Specifically, the electroplating seed layer 120 is connected to the cathode of the DC power supply for plating, the anode of the DC power supply is placed in an aqueous solution of copper sulfate, and the chip is immersed in the copper sulfate solution. The DC power supply is then turned on, and copper forms on the exposed surface of the electroplating seed layer 120, in the form of copper pillars or cylinders, to form the columnar electrodes. The height of the columnar electrodes may be the same with the depth of the second openings 135, or the height of the columnar electrodes may be less than the depth of the second openings 135.

The first columnar electrodes 141 and the second columnar electrodes 142 are then formed in the second openings 135. In the final semiconductor packaging structure, the first columnar electrodes are electrically connected to the solder pads and to the solder terminals in the packing substrate, such that the internal circuits of the chip can be connected to external circuitry through the first columnar electrodes and the solder terminals. The second columnar electrodes are electrically isolated from the solder pads and the first columnar electrodes. The second columnar electrodes are connected with a first heat radiating plate in the packaging substrate to transfer heat generated on the surface of the chip to the first heat radiating plate for cooling. The cooling capacity of the semiconductor packaging structure can be improved, without affecting the circuit configuration of the chip.

Alternatively, in certain other embodiments, only the first columnar electrodes are formed in the second openings, and the second columnar electrodes may be omitted. The chip can be electrically connected to the packaging substrate through the first columnar electrodes and the subsequently-formed first solder balls.

In one embodiment, the first columnar electrodes 141 are located on the first surface 105 of the chip 100, near the edge of the chip 100, and on the solder pads 101. The second columnar electrodes 142 are located on the first surface 105 of the chip 100, near the center of the chip 100. Certainly, in other embodiments, the first columnar electrodes may be located on the first surface 105 near the middle of the chip 100, and the second columnar electrodes may be located on the first surface 105 near the edge of the chip 100. Or the first columnar electrodes and the second columnar electrodes may be arranged alternatingly for improved heat transfer.

The first columnar electrodes are used to electrically connect the chip with the packaging substrate, while the second columnar electrodes are used to transfer the heat from the surface of the chip to the first heat radiating plate in the packaging substrate for cooling. Thus, the first columnar electrodes and the second columnar electrodes are disposed independently with each other.

In one embodiment, the height of the first columnar electrodes 141 and/or the second columnar electrodes 142 is in the range of approximately 4 µm~100 µm. Because the subsequently-formed first solder balls and second solder balls are formed on the top of the columnar electrodes, the distance between the chip and the packaging substrate is the total height of the columnar electrodes and the solder balls. By controlling the height of the columnar electrodes, the distance between the chip and the packaging substrate can be adjusted according to the solder balls. Thus, such distance can be adjusted to, on one hand, ensure the gap between the chip and the packaging substrate can be completely filled by the encapsulation resin material and, on the other hand, to reduce the thickness of the entire semiconductor packaging structure to a desired level.

Further, the subsequently-formed first solder balls and second solder balls are formed on the top and the side wall surface of the columnar electrodes. During a subsequent reflow process, the molten solder and the surface of the diffusion barrier layer of the columnar electrode have surface tension, so that the solder can evenly covering the surface of the diffusion barrier layer. Thus, the solder balls on the columnar electrodes occupy significantly less area, increasing solder joint density and improving packaging density.

Figure 5:
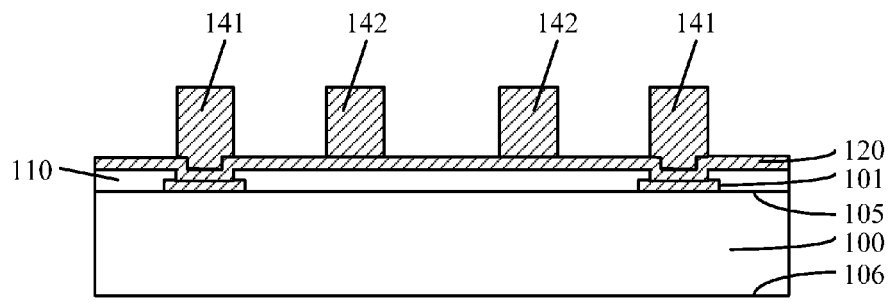

Returning to FIG. 16, after the columnar electrodes are formed, the second mask layer is removed (S104). FIG. 5 illustrates a corresponding structure.

As shown in FIG. 5, the second mask layer 130, exposing the electroplating seed layer 120 and the first columnar electrodes 141 and the second columnar electrodes 142.

The second mask layer 130 may be removed using an ashing process. The electroplating seed layer 120 is not removed because subsequent diffusion barrier layer and wetting layer may be formed using a plating process.

In certain other embodiments, subsequent diffusion barrier layer and wetting layer may be formed using an electroless plating process. Part of the electroplating seed layer 120 may also be removed after removing the second mask layer.

For example, the electroplating seed layer 120 may be removed by: forming a fourth mask layer (not shown) on the electroplating seed layer and the fourth mask layer covers the columnar electrodes; using the fourth mask layer as a mask, a wet etching process or a dry etching process is performed to remove the exposed electroplating seed layer and to retain remaining portions of the electroplating seed layer around the columnar electrodes; and removing the fourth mask layer.

In other embodiments, after removing the second mask layer, a dry etching process may be performed to etch back the portion of the electroplating seed layer not covered by the columnar electrodes. Because the electroplating seed layer is often thin while the columnar electrodes are significantly thick, the etching time and etching power can be controlled such that the removal of the electroplating seed layer does not have any substantial impact of the columnar electrodes.

Figure 6:
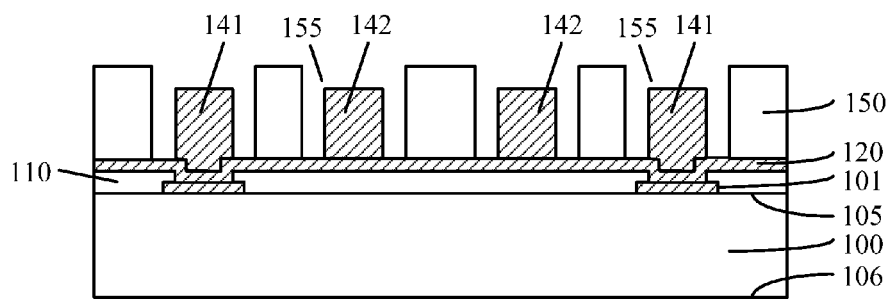

Returning to FIG. 16, after the second mask layer is removed, a first mask layer is formed on the electroplating seed layer 120 (S105). FIG. 6 illustrates a corresponding structure.

As shown in FIG. 6, first mask layer 150 is formed on the surface of the electroplating seed layer 120. The first mask layer 150 has a plurality of first openings 155 at locations corresponding to the first columnar electrodes 141 and the second columnar electrodes 142. The size of the first openings 155 may be greater that the size of the first columnar electrodes 141 and the size of the second columnar electrodes 142, and the side wall of the first openings 155 have a gap from the side wall of the first columnar electrodes 141 and the side wall of the second columnar electrodes 142.

The first mask layer 150 may be made of any appropriate material, such as one or more of photoresist, silicon oxide, silicon nitride, and amorphous, etc. In one embodiment, the first mask layer 150 is a photoresist layer. A photolithography process may be used to etch the photoresist layer to form the first openings 155. Because there are gaps between the side walls of the first openings 155 and the side walls of the first columnar electrodes 141 and the second columnar electrodes 142, a first diffusion barrier layer can be subsequently formed on the top and the side wall of a first columnar electrode and also on the exposed surface of the electroplating seed layer surround the first columnar electrode.

Similarly, a second diffusion barrier layer can be subsequently formed on the top and the side wall of a second columnar electrode and also on the exposed surface of the electroplating seed layer surround the second columnar electrode. Thus, the cross-sectional shape of the first diffusion barrier layer and the cross-sectional shape of the second diffusion barrier layer may be a "U" shape with curled up edges. In certain other embodiments, the electroplating seed layer may be unexposed or may be removed previously, the diffusion barrier layer may be formed only on the top and side wall of the columnar electrodes.

Figure 7:
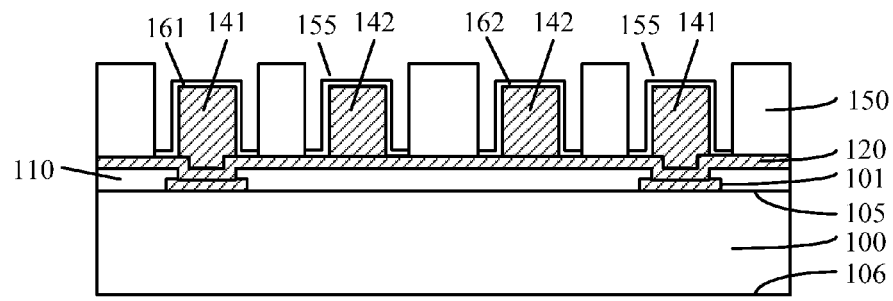

Returning to FIG. 16, after the first mask layer is formed on the electroplating seed layer 120, diffusion barrier layers may be formed on the columnar electrodes (S106). FIG. 7 illustrates a corresponding structure.

As shown in FIG. 7, diffusion barrier layers are formed on the top surfaces and sidewall surfaces of the first column electrodes 141 and the second columnar electrodes 142, and on the surface of the electroplating seed layer 120 exposed by the first openings 155. Specifically, first diffusion barrier layer 161 is formed on the surfaces of the first columnar electrodes 141, and the second diffusion barrier layer 162 is formed on the surfaces of the second columnar electrodes 142.

When the copper in the columnar electrodes is in direct contact with the tin in the solder balls, reaction between the copper and tin may create ε-phase tin-copper intermetallic compound (IMC), which may cause the contact surface prone to tin shrinkage or tin repulsive and, thus, may cause the solder balls easily fall from the top surface of the columnar electrodes. Therefore, as disclosed, the diffusion barrier layers on the surfaces of the columnar electrodes may prevent the copper in the columnar electrodes from reacting with the tin in the solder balls to form ε-phase tin-copper intermetallic compound.

In one embodiment, the first diffusion barrier layer 161 and the second diffusion barrier layer 162 are nickel layers. The nickel layer can prevent the diffusion of copper in the columnar electrodes to the solder balls to react with the tin in the solder balls to form ε-phase tin-copper intermetallic compound. Thus, the solder balls are not easily fall from the top surfaces of the columnar electrodes. Further, the nickel layer can avoid oxidation of the columnar electrode surface, which may impact resistance of the columnar electrodes. In certain embodiments, the first diffusion barrier layer 161 and the second diffusion barrier layer 162 are formed by an electroless plating process. In certain other embodiments, the first diffusion barrier layer 161 and the second diffusion barrier layer 162 are formed by an electroplating process.

Whether an electroless plating process or an electroplating process is used to form the diffusion barrier layers, the diffusion barrier layers are formed as plating layers on the metal surfaces. The nickel layers are formed on the top surfaces and sidewall surfaces of the first columnar electrodes 141 and the second columnar electrodes 142, and on the surface of the electroplating seed layer 120 exposed by the first opening 155. Thus, the cross-sectional shape of the first diffusion barrier layer and the cross-sectional shape of the second diffusion barrier layer may be a "U" shape with curled up edges, and the bottom end of the diffusion barrier layer is in parallel with the surface of the solder pads 101 and in connection with the electroplating seed layer 120.

Thus, the subsequently-formed wetting layer also has a cross-sectional "U" shape with curled up edges. The subsequently-formed solder balls not only can be located on the top surfaces and sidewall surfaces of the columnar electrodes, but also can be located on the surface of the diffusion barrier layer on the electroplating seed layer 120. That is, the solder balls contact with three surfaces of the diffusion barrier layers, improving the bonding force between the solder balls and the columnar electrodes. The solder balls can then be restrained from moving up-down or side-to-side, making the solder balls not easily fall off and improving the reliability of the packaging structure.

Further, because the cross-sectional shape of the diffusion barrier layer is a "U" shape with curled up edges, the bottom end of the diffusion barrier layer is in parallel with the surface of the solder pads 101 and in connection with the electroplating seed layer 120, and the upper end of the diffusion barrier layer covers the top surfaces and the sidewall surfaces of the columnar electrodes, the diffusion barrier layers improve the bonding force between the columnar electrodes and the electroplating seed layer 120, making the columnar electrodes not easily peel off from the electroplating seed layer 120.

Figure 8:
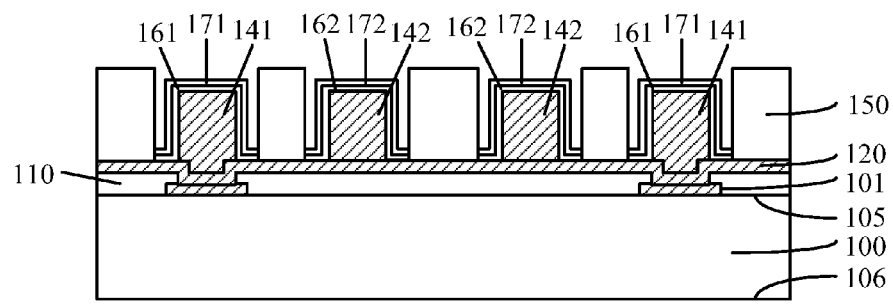

Returning to FIG. 16, after the diffusion barrier layers are formed on the columnar electrodes, a wetting layer is formed on top surfaces of the diffusion barrier layers (S107). FIG. 8 illustrates a corresponding structure.

As shown in FIG. 8, a wetting layer is formed on the top of the first diffusion barrier layer 161 and the second diffusion barrier layer 162. Specifically, a first wetting layer 171 is formed on the surface of the first diffusion barrier layer 161, and a second wetting layer 172 is formed on the surface of the second diffusion barrier.

The first wetting layer 171 and the second wetting layer 172 may be made of any appropriate material. In certain embodiments, the first wetting layer 171 and the second wetting layer 172 may includes at least one of gold, silver, indium, and tin, such as a gold layer, a silver layer, a tin layer, a tin-silver alloy layer, an indium-tin alloy layer, etc. The first wetting layer 171 and the second wetting layer 172 may be formed by an electroless plating process or an electroplating process.

While nickel can also easily react with oxygen in the air, the wetting layer containing a gold element, a silver element, an indium element, or a tin element is less likely to react with oxygen in the air. Thus, forming the wetting layer on the surface of the nickel layer can prevent an oxidized layer being formed on the surface of the nickel layer. Further, the solder may have a better wettability on the surface of the wetting layer containing a gold element, a silver element, an indium element, or a tin element. The subsequently-formed solder balls after a reflow process may have a relatively strong bonding force with the columnar electrodes, making the solder balls difficult to peel off.

Further, gold, silver, and copper have a lower resistance, and the wetting layer may have a certain degree of mutual diffusion with the diffusion barrier layer and/or with the solder balls to form some alloy layer. Such alloy may contain gold, silver, or copper, and may effectively reduce the interconnect resistance of the packaging structure.

In one embodiment, the first wetting layer 171 and the second wetting layer 172 are a tin layer formed by an electroplating process. The plating solution for the tin plating layer may include approximately 40 to 60 grams per liter of sodium stannates, 10 to 16 grams per liter of sodium hydroxide, and 20 to 30 grams per liter of sodium acetate. The bath temperature may be set to approximately 70 to 85 degrees Celsius.

As the main component of solder balls is tin, the composition of solder balls may be substantially the same with that of the tin layer (i.e., tin wetting layer). Further, the melting point of the solder balls and the tin layer is relatively low. In the subsequent reflow process, the solder balls on the columnar electrodes and the tin layer may diffuse together after molten to form a whole solder ball structure. Because the cross-sectional shape of the tin layers a "U" shape with curled up edges, the cross-sectional shape of the final solder balls is also a "U" shape with curled up edges. Thus, the solder ball wraps the wetting layer on the top surfaces of the columnar electrodes, the wetting layer on the sidewall surfaces of the columnar electrodes, and the wetting layer on the surface of the electroplating seed layer. It may be difficult to shake or move the solder balls, improving the reliability of the solder balls.

In certain other embodiments, the wetting layer may be omitted and the solder balls are formed on the surface of the diffusion barrier layers.

Figure 9:
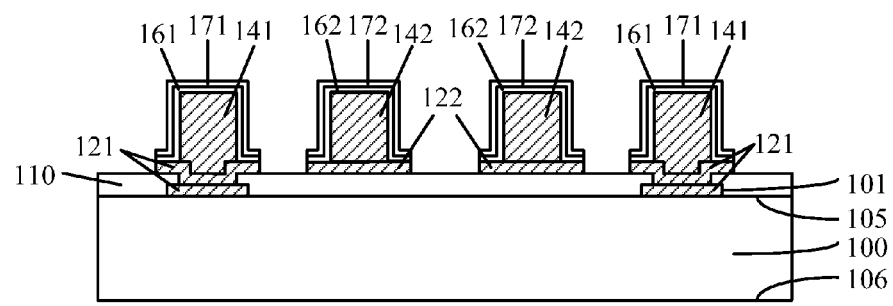

Returning to FIG. 16, after the wetting layer is formed on top surfaces of the diffusion barrier layers, the first mask layer is removed and bottom metal layers are formed (S108). FIG. 9 illustrates a corresponding structure.

As shown in FIG. 9, the first mask layer 150 is removed, the exposed electroplating seed layer 120 is etched to form a metal interconnect layer including a first bottom metal layer 121 and a second bottom metal layer 122.

In certain embodiments, the metal interconnect layer includes the solder pads 101 and the electroplating seed layer 120 on the surface of solder pads 101 and the insulating layer 110. After the electroplating seed layer 120 is etched, the metal interconnect layer is divided into the first bottom metal layer 121 and the second bottom metal layer 122. The first bottom metal layer 121 includes solder pads 101 and part of the electroplating seed layer 120 electrically connected to the solder pads, and the first columnar electrodes 141 are arranged on the surface of the first bottom metal layer 121. The second bottom metal layer 122 includes part of the electroplating seed layer 120 electrically isolated from the solder pads 101, and the second columnar electrodes 142 are arranged on the surface of the second bottom metal layer 122.

In certain other embodiments, when the metal interconnect layer includes the solder pads, the electroplating seed layer on the surface of solder pads, and redistribution metal layer on the electroplating seed layer, portions of the redistribution metal layer and the electroplating seed layer are etched away to form the interconnect metal layer. The interconnect metal layer includes a first bottom metal layer and a second bottom metal layer. The first bottom metal layer includes the solder pads, part of the electroplating seed layer on the surface of solder pads and the insulating layer, and part of redistribution metal layer on that part of the electroplating seed layer and electrically connected to the solder pads. The first columnar electrodes are arranged on the surface of the first bottom metal layer. The second bottom metal layer includes part of the electroplating seed layer electrically isolated from the solder pads and part of redistribution metal layer on that part of the electroplating seed layer. The second columnar electrodes are arranged on the surface of the second bottom metal layer.

The first mask layer 150 may be removed using an ashing process. The exposed electroplating seed layer and/or the redistribution metal layer may be removed by the following process: forming a fifth mask layer (not shown) on the electroplating seed layer and/or the redistribution metal layer and covering the first columnar electrodes and the second columnar electrodes; using the fifth mask layer as a mask, a wet etching process or a dry etching process is performed to remove the exposed electroplating seed layer and/or the redistribution metal layer; and then the fifth mask layer is removed.

In other embodiments, after removing the first mask layer, a dry etching process may be performed to etch back the portion of the electroplating seed layer not covered by the columnar electrodes. Because the electroplating seed layer is often thin while the columnar electrodes are significantly thick, the etching time and etching power can be controlled such that the removal of the electroplating seed layer does not have any substantial impact of the columnar electrodes.

Further, in certain embodiments, after removing the exposed electroplating seed layer by an etching process, a passivation layer may be formed on the insulating layer and the redistribution metal layer and exposing the columnar electrodes. The passivation layer may insulate the chip from the outside environment electrically and from outside moisture. The passivation layer may be made of any appropriate material, including one or more of silicon oxide, silicon nitride, silicon oxynitride, polyimide, epoxy resin, phenol resin, and benzoxazine resin, etc. Alternatively, the solder balls may be formed first, and then the passivation layer is formed.

Figure 10:
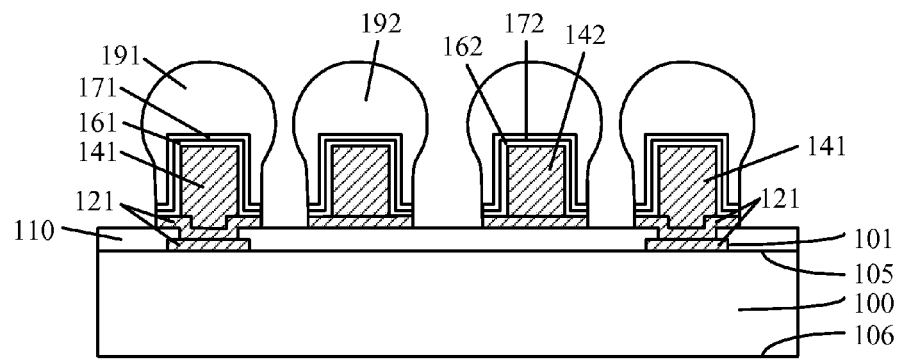

Returning to FIG. 16, after the first mask layer is removed and bottom metal layers are formed, solder balls are formed on the surface of the wetting layer on the columnar electrodes (S109). FIG. 10 illustrates a corresponding structure.

As shown in FIG. 10, solder balls are formed on the surface of the wetting layer of the columnar electrodes. Specifically, first solder balls 191 are formed on the first wetting layer 171 of the first columnar electrodes 141, and second solder balls 192 are formed on the surface of the second wetting layer 172 of the second columnar electrodes 142.

The process for forming the first solder balls 191 and the second solder balls 192 may include a solder paste forming process and a reflow process. First, the solder paste forming process is used to form solder paste on the surface of the first columnar electrodes 141 and the surface of the second columnar electrodes 142. Further, the reflow process is performed to reflow the solder paste to form first solder balls 191 wrapping the top surface of the first columnar electrodes 141, the sidewall surface of the first columnar electrodes 141, and the surface of the first wetting layer 171 on the electroplating seed layer. The reflow process also forms the second solder balls 192 wrapping the top surface of the second columnar electrodes 142, the sidewall surface of the second columnar electrodes 142, and the surface of the second wetting layer 172 on the electroplating seed layer.

The solder may include tin, tin-lead mixture, or other tin alloy, etc. The solder paste forming process may include: screen printing the solder paste, forming tin solder balls using a spot soldering process, forming a tin layer using an electroless plating process, forming a tin layer using an electroplating process. The reflow process may include an ultrasonic reflow process, a hot air reflow process, an infrared reflow process, a laser reflow process, or a vapor-phase reflow, etc.

As the surface energy of the above-described wetting layer is relatively large and has a better wettability. During the reflow process, the solder will not only be located at the top of the columnar electrodes, but also flow to the sidewalls and bottoms of the sidewalls of the columnar electrodes. Further, by controlling the amount of the solder paste, first solder balls 191 can be formed to cover the surface of the first wetting layer 171 on the electroplating seed layer, and the second solder balls 192 can be formed to cover the surface of the second wetting layer 172 on the electroplating seed layer. Because the contact surface between the solder balls and the columnar electrodes includes at least the top surface and the sidewall curve surfaces, when an external force is applied on the solder balls 192, it may be difficult for the solder balls to peel off from the surface of the columnar electrodes.

Figure 11:
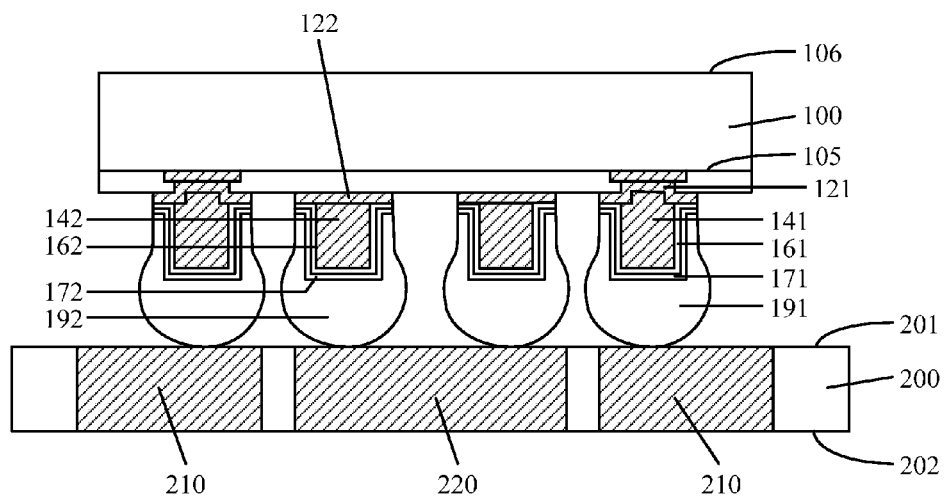

Returning to FIG. 16, after the solder balls are formed on the surface of the wetting layer on the columnar electrodes, the chip is packaged onto the packaging substrate (S110). FIG. 11 illustrates a corresponding structure.

As shown FIG. 11, a packaging substrate 200 is provided. The packaging substrate 200 has solder terminals 210 and first heat radiating plate 220. The location of the solder terminals 210 corresponds to the location of the first solder balls 191. The location of the first heat radiating plate 220 may correspond to the location of the second solder balls 192.

Further, the chip 100 is flipped onto the packaging substrate 200, the first solder balls 191 of the chip 100 is interconnected with the solder terminals 210, and the second solder balls 192 of the chip 100 is interconnected with the first heat radiating plate 220.

Alternatively, in certain other embodiments, before the chip is packaged on the packaging substrate, the chip may be thinned and diced into separate chip units.

The packaging substrate 200 corresponds to the chip 100. In certain embodiments, the chip 100 has the first columnar electrodes 141 and the second columnar electrodes 142, and the packaging substrate 200 has corresponding solder terminals 210 and the first heat radiating plate 220, respectively. The first heat radiating plate 220 may be made of a metal material with desired thermal properties, such as copper and aluminum, etc.

The first solder balls are located on the first surface 105 near the edge of the chip 100, and the second solder balls are located on the first surface 105 near the center of the chip 100. Correspondingly, the solder terminals are located near the edge of the packaging substrate, and the first heat radiating plate is located near the center of the packaging substrate. In certain other embodiments, locations of the solder terminals and the first heat radiating plate may be configured to correspond to the positions of the first solder balls and the second solder balls of the chip 100.

The first heat radiating plate 220 may include one or more plates. In certain embodiments, the first heat radiating plate 220 is located in the middle of the packaging substrate 200 and the plurality of second solder balls 192 are bonded to the same first heat radiating plate 220. In certain other embodiments, multiple first heat radiating plates are used and one or more second solder balls may correspond to a first heat radiating plate for heat dissipation.

Because the heat source of the chip 100 is often the first surface 105 with circuit structures, the second columnar electrodes 142 and the second solder balls 192 can transfer the heat generated by the first surface 105 to the first heat radiating plate for cooling, effectively improving the thermal efficiency.

The first heat radiating plate 220 may be in any appropriate shape. For example, the first heat radiating plate 220 may be in a regular geometric shape, such as a square, a rectangle, or a triangle, etc., or may be in an irregular shape. To improve heat dissipation capacity, the first heat radiating plate 220 may be arranged on any locations where solder terminals 210 are not present. Thus, the first heat radiating plate 220 may be centralized at the center of the packaging substrate or at the edge of the packaging substrate. The first heat radiating plate 220 may also be distributed over the packaging substrate, or may be alternatingly arranged with the soldering terminal 210.

In certain embodiments, the height of the columnar electrodes may be relatively large. If the number of the first columnar electrodes is relatively small, the anti-extrusion capacity of the chip may be less than desired, which may cause deformation of the first columnar electrodes. Thus, the number of the columnar electrodes may be increased, with some columnar electrodes that do not need to connect to circuitry as the second columnar electrodes, to increase the anti-extrusion capacity during packaging process and transportation process and to avoid deformation to the columnar electrodes.

The packaging substrate 200 may be any appropriate substrate, such as one of a resin substrate, a ceramic substrate, a glass substrate, a silicon substrate, a metal substrate, a metal frame, and an alloy frame.

In one embodiment, the packaging substrate 200 is a metal frame. The solder terminals 210 and the first heat radiating plate 220 are located within the substrate 200 and through the packaging substrate 200. The solder terminals 210 on the first surface 201 of the packaging substrate 200 and the first heat radiating plate 220 are interconnected to the first solder balls 191 and the second solder balls 192, respectively. Subsequently, when the packaging structure is mounted on a printed circuit board (PCB), the solder terminals 210 on the second surface 202 of the packaging substrate 200 are interconnected to the solder pads on the PCB. Thus, such semiconductor packaging structure does not need additional leads, PCB mount area is significantly reduced, and the packaging height is also reduced. The final product can be formed significantly thinner.

Alternatively, in certain other embodiments, the packaging substrate may be without the first heat radiating plate. Correspondingly, the chip 100 may also be without the second columnar electrodes. The first columnar electrodes and the first solder balls are used to connect the chip with the solder terminals of the packaging substrate.

In certain other embodiments, the solder terminals of the packaging substrate may be located on the first surface of the packaging substrate. The first surface of the packaging substrate may also have leads electrically connected to the solder terminals. The leads may then be used to connect the packaging substrate to the PCB.

Figure 12:
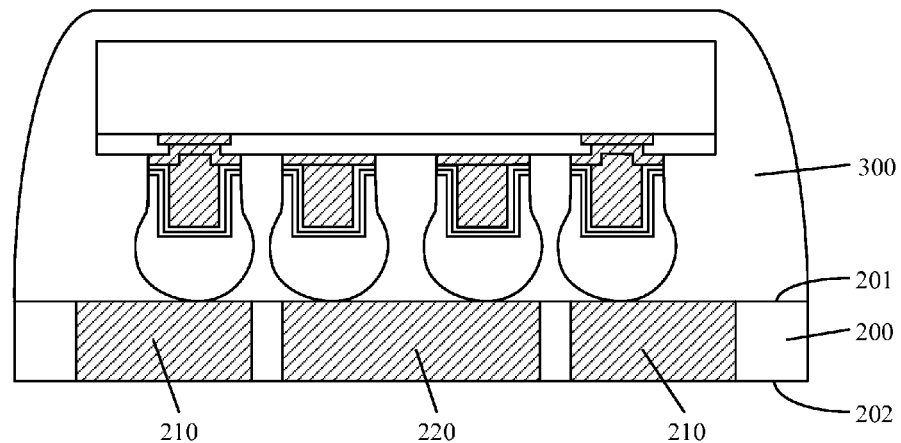

Returning to FIG. 16, after the chip is packaged onto the packaging substrate, the packaged chip is encapsulated to form the packaging structure (S111). FIG. 12 illustrates a corresponding structure.

As shown in FIG. 12, encapsulation resin material 300 is filled in the space between the chip 100 and the packaging substrate 200 and on the surfaces of the chip 100 and the packaging substrate 200.

Because the distance between the chip 100 and the packaging substrate 200 is relatively large, a one-step molding process may be used to directly fill the encapsulation resin material 300 in the space between the chip 100 and the packaging substrate 200 and to cover the surfaces of the chip 100 and the packaging substrate 200. The process is simplified and the manufacturing cost is reduced. In one embodiment, the encapsulation resin material 300 is an epoxy resin. Of course, any appropriate semiconductor encapsulation resin material can also be used.

In certain other embodiments, an underfill may be first filled in the space between the chip and the packaging substrate, and then the surfaces of the chip and the packaging substrate may be covered by the encapsulation resin material.

The underfill may be a liquid silicon-containing epoxy resin material, so that it may be ensured that no gap exists between the chip and the packaging substrate, improving the reliability of the chip.

Figure 13:
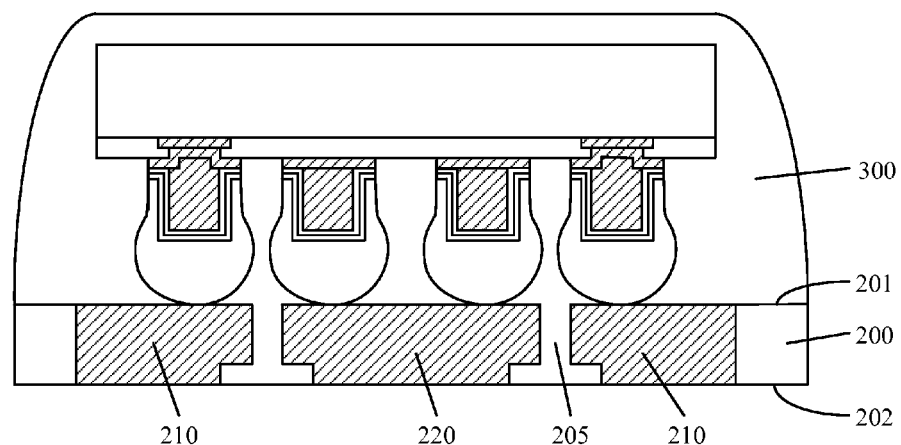

In certain embodiments, as shown in FIG. 13, the encapsulation substrate 200 may also have openings 205. The opening 205 may be in an inverted 'T' shape, with the smaller opening end near the first surface 201 of the packaging substrate and the larger opening end near the second surface 202 of the packaging substrate. The openings 205 are filled with encapsulation resin material or underfill such that the encapsulation resin material or the underfill does not easily peel off from the packaging substrate 200 and, thus, the chip 100 does not easily peel off from the packaging substrate.

Figure 14:
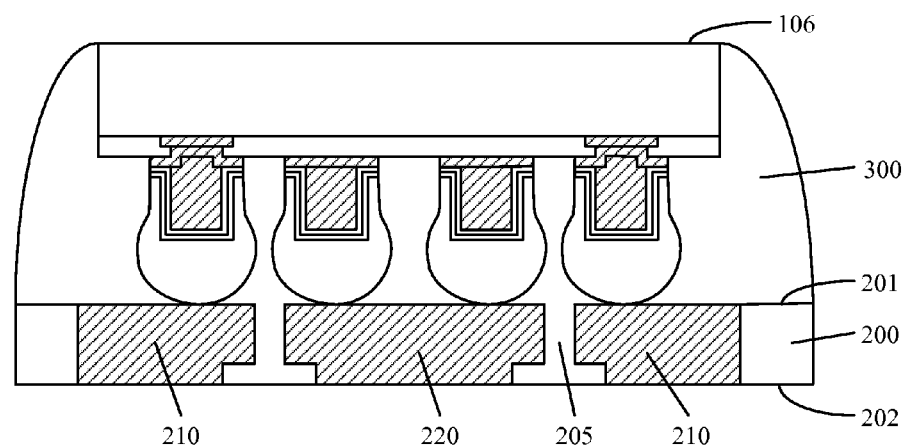

In certain embodiments, the encapsulation resin material 300 covers the second surface 106 of the chip 100. In certain other embodiments, as shown in FIG. 14, the encapsulation resin material 300 may expose the second surface 1066 of the chip 100, and only covers the sidewall surface of the chip and the surfaces of the packaging substrate 200. The second surface of the chip may be used for heat dissipation, improving the cooling effect.

In certain other embodiments, as shown in FIG. 15, a second heat radiating plate 400 may be attached to the second surface 106 of the chip 100 using a heat conductive adhesive paste. The second heat radiating plate 400 may have a surface area larger than that of the chip 100, improving the cooling capacity of the semiconductor packaging structure. The second heat radiating plate 400 may be made of a metal with desired thermal properties, such as copper and aluminum. The chip 100 is insulated from the outside through the second heat radiating plate and the encapsulating resin material, avoiding impact from outside electric charges or moisture.

Therefore, a semiconductor packaging structure is provided, as shown in FIG. 12. The semiconductor packaging structure includes a chip 100. The chip 100 has a first surface 105 and second surface 106. A first bottom metal layer 121 is formed on the first surface 105 of the chip 100, and first columnar electrodes 141 are formed on the first bottom metal layer 121. A portion of the first bottom metal layer 121 is exposed around the first columnar electrodes 141, and a first diffusion barrier layer 161 is formed on the top surface and the sidewall surface of the first columnar electrodes 141 and on the surface of the exposed first bottom metal layer 121. A first wetting layer 171 is formed on the surface of the first diffusion barrier layer 161, and first solder balls 191 are formed on the first wetting layer 171. The first solder ball 191 wraps the surfaces of the first wetting layer 171 on the top surface and the sidewall surface of the first columnar electrodes 141 and on the surface of the exposed first bottom metal layer 121.

A second bottom metal layer 122 is formed on the first surface 105 of the chip 100, and second columnar electrodes 142 are formed on the second bottom metal layer 122. A portion of the second bottom metal layer 122 is exposed around the second columnar electrodes 142, and a second diffusion barrier layer 162 is formed on the top surface and the sidewall surface of the second columnar electrodes 142 and on the surface of the exposed second bottom metal layer 122. A second wetting layer 172 is formed on the surface of the second diffusion barrier layer 162, and second solder balls 192 are formed on the second wetting layer 172.

The second solder ball 192 wraps the surfaces of the second wetting layer 172 on the top surface and the sidewall surface of the second columnar electrodes 142 and on the surface of the exposed second bottom metal layer 122.

The semiconductor packaging structure also includes a packaging substrate 200 disposed opposite to the first surface 105 of the chip 100. The packaging substrate 200 has solder terminals 210 and the first heat radiating plate 220. The locations of the solder terminals 210 correspond to the positions of the first solder balls 191, and the location of the first heat radiating plate 220 corresponds to the positions of the second solder balls 192. The chip 100 is flipped and mounted onto the packaging substrate 200. The first solder balls 191 of the chip 100 are interconnected with the solder terminals 210, and the second balls 192 of the chip 100 are interconnected with the first heat radiating plate 220. Further, encapsulation resin material 300 is filled in the space between the chip 100 and the packaging substrate 200 and covers the surfaces of the chip 100 and the packaging substrate 200.

Other applications and advantages are obvious to those skilled in the art.

What is claimed is:

1. A semiconductor packaging method, comprising:
providing a semiconductor substrate, the semiconductor substrate having a first surface and a second surface;
forming solder pads on the first surface of the semiconductor substrate;
forming an insulating layer on the first surface of the semiconductor substrate and exposing the solder pads;
forming an electroplating seed layer on the exposed solder pads and on the insulating layer on the first surface of the semiconductor substrate;
forming a plurality of columnar electrodes over the electroplating seed layer, the columnar electrodes including first columnar electrodes over first portions of the electroplating seed layer on the exposed solder pads, and second columnar electrodes over second portions of the electroplating seed layer on the insulating layer;
forming a diffusion barrier layer in a "U" shape with curled up edges to cover a top surface and sidewall of each columnar electrodes and to cover a top surface of the each portion of the electroplating seed layer surrounding the columnar electrode;
forming a wetting layer over the diffusion barrier layer on the first columnar electrodes and the second columnar electrodes, such that the wetting layer has a cross-section in a "U" shape with curled up edges;
after forming the barrier layer, removing portions of the electroplating seed layer between adjacent columnar electrodes to simultaneously form first columnar electrodes together with the "U" shaped wetting layer and the diffusion barrier layer thereon to electrically connect to the semiconductor substrate via a solder pad and the electroplating seed layer, and simultaneously form second columnar electrodes together with the "U" shaped wetting layer and the diffusion barrier layer thereon to be electrically isolated from the semiconductor substrate by the insulating layer;
forming a first solder ball over the diffusion barrier layer on each first columnar electrode;
providing a packaging substrate having solder terminals corresponding to the solder balls; and
mounting the semiconductor substrate onto the packaging substrate in a flipped position, such that the first solder balls are connected with the solder terminals.

2. The method according to claim 1, further including:

forming a second solder ball over the diffusion barrier layer on each second columnar electrode, wherein the second solder balls are connected with a first heat radiating plate on the packaging substrate for transferring heat generated by the first surface of the semiconductor substrate to an external circuitry.

3. The method according to claim 1, wherein:

the diffusion barrier layer is a nickel layer and the wetting layer is made of tin.

4. The method according to claim 1, wherein:

a first heat radiating plate includes one or more of heat radiating plates, and the first heat radiating plate has a regular geometric shape.

5. The method according to claim 1, further including:

filling an encapsulation resin material in a space between the semiconductor substrate and the packaging substrate, and on surfaces of the semiconductor substrate and the packaging substrate.

6. The method according to claim 5, further including:

filling the space between the semiconductor substrate and the packaging substrate with an underfill.

7. The method according to claim 1, wherein:

the packaging substrate is one of a resin substrate, a ceramic substrate, a glass substrate, a silicon substrate, a metal substrate, a metal frame, and an alloy frame.

8. The method according to claim 1, wherein:

the first columnar electrodes are located on the first surface near the edge of the semiconductor substrate and the second columnar electrodes are located on the first surface near the center of the chip.

9. The method according to claim 1, wherein:

the first columnar electrodes and the second columnar electrodes have a height in the range of approximately 4 μm to 100 μm.

10. The method according to claim 1, wherein:

a second heat radiating plate is attached to the second surface of the semiconductor substrate.

11. The method according to claim 1, wherein each solder ball has a cross-section in a "U" shape.

* * * * *